United States Patent [19]

Baldauf et al.

[11] Patent Number: 4,597,177
[45] Date of Patent: Jul. 1, 1986

[54] FABRICATING CONTACTS FOR FLEXIBLE MODULE CARRIERS

[75] Inventors: Lawrence M. Baldauf, Austin; Edward J. Girvan, Round Rock; Richard B. Overfield, Austin; Gilbert C. Roberts, Round Rock, all of Tex.

[73] Assignee: International Business Machines Corporation, Armonk, N.Y.

[21] Appl. No.: 567,704

[22] Filed: Jan. 3, 1984

[51] Int. Cl.$^4$ ............................................ H01R 43/02
[52] U.S. Cl. .................... 29/878; 174/68.5; 428/415
[58] Field of Search ............... 29/825, 846, 876, 848, 29/877, 874, 878, 888, 402.18; 174/68.5; 200/159 B; 428/901, 415

[56] References Cited

U.S. PATENT DOCUMENTS

| | | | |
|---|---|---|---|
| 3,364,566 | 1/1968 | Hermann | 29/626 |
| 3,601,523 | 8/1971 | Arndt | 174/68.5 |
| 3,955,024 | 5/1976 | Goldman et al. | 428/415 X |
| 4,076,575 | 2/1978 | Chang | 156/656 |
| 4,080,513 | 3/1978 | Cuneo et al. | 174/68.5 |
| 4,124,926 | 11/1978 | Kupsky | 29/25.13 |
| 4,288,916 | 9/1981 | Verma | 29/828 |
| 4,314,002 | 2/1982 | Oizumi et al. | 428/415 X |
| 4,353,954 | 10/1982 | Yamaoka et al. | 174/68.5 X |
| 4,389,771 | 8/1983 | Cassidy et al. | 29/825 X |
| 4,445,952 | 5/1984 | Reynolds, III et al. | 29/402.18 X |

FOREIGN PATENT DOCUMENTS

| | | | |
|---|---|---|---|
| 1075825 | 4/1980 | Canada | 29/846 |
| 3006591 | 8/1981 | Fed. Rep. of Germany | 200/159 B |
| 3006592 | 8/1981 | Fed. Rep. of Germany | 200/159 B |

OTHER PUBLICATIONS

IBM Tech. Discl. Bull., vol. 11, No. 7, Dec. 1968, p. 733, by McDermott.
IBM Technical Disclosure Bulletin, vol. 14, No. 6, Nov. 1971, p. 1805, "External Pre-Lamination Via Connections in Multilayers", Crimi et al.

Primary Examiner—Howard N. Goldberg
Assistant Examiner—Carl J. Arbes
Attorney, Agent, or Firm—Andrea P. Bryant

[57] ABSTRACT

Disclosed is a method of fabricating a novel printed circuit structure including a relatively small surface area of flexible material integral with a conventional glass epoxy carrier on which electrical contacts may be formed.

5 Claims, 5 Drawing Figures

FABRICATING CONTACTS FOR FLEXIBLE MODULE CARRIERS

TECHNICAL FIELD

This invention relates to printed circuit structures. More particularly it relates to a method of fabricating a flexible surface as an integral part of a glass-epoxy carrier on which surface electrical contacts will be formed.

BACKGROUND ART

Conventional techniques for providing contacts for flexible multilayer circuit structures use a polyimide film as a leveling surface. The polyimide ensured uniform mating of the electrical contacts on the polyimide with those of the module. However, polyimide is very much more expensive than standard glass epoxy. Such a design further required circuit protective layers on both surfaces of the structure for protection of the copper conductors.

DISCLOSURE OF THE INVENTION

The present method of fabricating contacts for flexible module carriers yields a less expensive structure. The surface on which contacts of the flexible module carrier rest is made an integral part of a glass epoxy carrier. Unlike prior art structures wherein the whole carrier was flexible, the present invention provides a structure with small flexible areas surrounded by relatively rigid areas. Furthermore less gold is required to plate the smaller connector pads. A photosensitive plating resist used in one step of the fabrication process for masking open areas for contacts and connection points may serve the additional function of protecting the copper circuitry and plated through holes if allowed to remain on the structure.

BRIEF DESCRIPTION OF THE DRAWING

The foregoing features and advantages of the invention will be apparent from the following more particular description of the preferred embodiment as illustrated in the accompanying drawing wherein the same reference numerals are used throughout to represent the same materials.

BEST MODE FOR CARRYING OUT THE INVENTION

Figure 1:
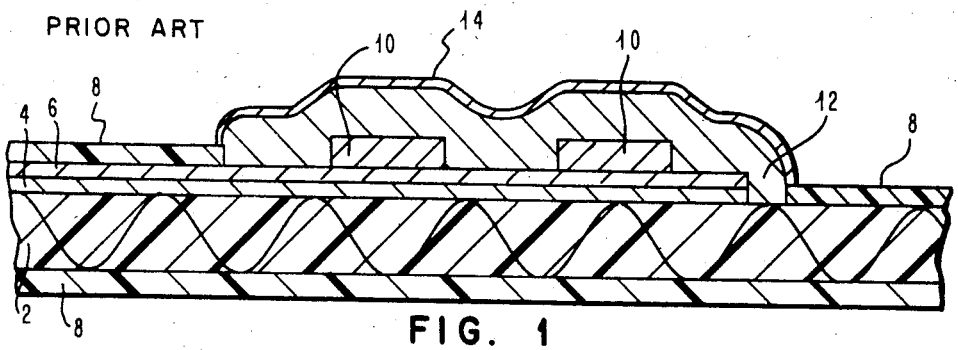
FIG. 1 shows a cross sectional view of a connector pad fabricated in accordance with a prior art technique.

FIG. 1 shows a structure representative of the prior art. A polyimide substrate 2 has placed thereon a layer of copper foil 4. Adjacent the copper foil 4 and coextensive therewith is a layer of copper plate 6. A coverlay of polyimide film 8 is coated on the upper and lower surfaces of the structure. Raised copper plate areas 10 are provided. They are covered with a coating of nickel 12 and the entire connector pad area is coated with gold 14 to provide good contact points.

Figure 2:
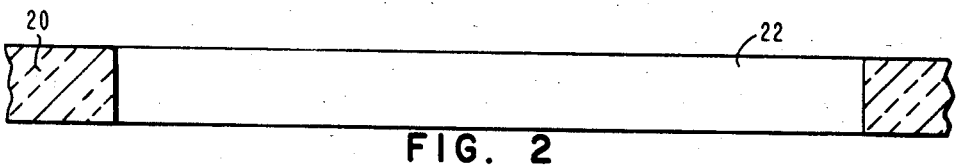
FIGS. 2-5 sequentially illustrate the fabrication steps in the manufacture of a structure in accordance with the present invention.

Referring now to FIG. 2, the manufacturing process for producing the improved connector pad will be described. A glass epoxy substrate 20 is provided with holes 22 where contact areas are desired. FIG. 2 shows one such hole in cross section.

Figure 3:
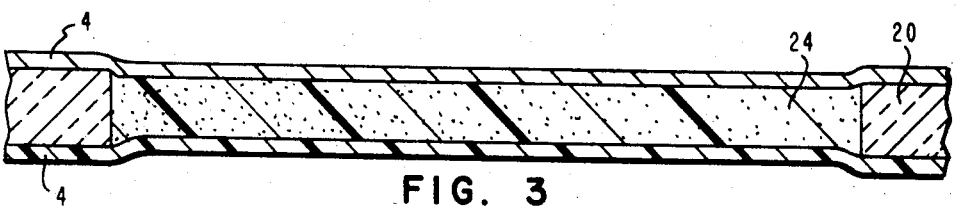

FIG. 3 shows the structure of FIG. 2 after a layer of copper foil 4 has been laminated on either side of substrate 20. During the foil lamination step with its attendant heat and pressure, epoxy advances from the B through gel stage to full cure. While undergoing cure the epoxy flows into hole 22 until cross linking is complete. An unreinforced surface 24 is formed which is 3 to 4 mils thick. Surface 24 is the area on which the contact pads will be made.

Figure 4:
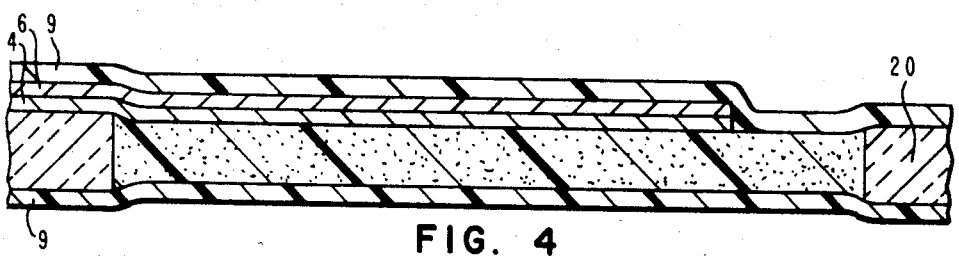
Figure 5:
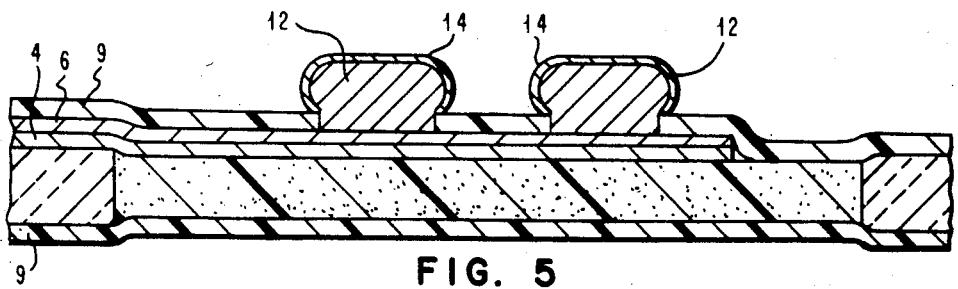

FIG. 4 illustrates the structure of FIG. 3 at the completion of the next step in the fabrication process. A layer of copper 6 has been plated over foil 4. A first dry film resist is applied, exposed and developed. The background copper is etched on both sides. The resist is stripped. The entire structure, that is, both surfaces of substrate 20, has been coated with a resist layer 9. A dry film photosensitive solder mask and protective coat has been applied using a roll laminator technique to form layer 9. The actual connector pad structure is fabricated using conventional techniques. The structure of FIG. 4 is exposed using appropriate pressure pad artwork for masking areas not to be plated thus providing a protective coating and insulator over copper circuitry. After the photo develop steps, nickel 12 and gold 14 are plated to result in the structure shown in FIG. 5 which has the required contact points (12, 14) protruding from the carrier 20.

If components with leads are desired to be used with contacts fabricated in accordance with the present invention, the following steps are added to the fabrication process. Through holes are drilled before copper layer 6 is plated on substrate 20. Fabrication proceeds as already described. After the nickel and gold plating steps, a laser beam may be used to remove protective resist layer 8 from the through holes. A solder wettable surface is provided in the through holes with copper-triazol.

While the invention has been particularly shown and described with reference to a preferred embodiment, it will be understood by those skilled in the art that the above and various other changes in form and detail may be made without departing from the spirit and scope of the invention.

What is claimed is:

1. In printed circuit fabrication, a method of forming contacts as an integral part of and in a substrate of gel stage epoxy glass comprising the sequential steps of:
   providing holes in the substrate where contacts are to be formed;
   sandwiching the substrate between layers of metal foil;
   applying heat and pressure for laminating the metal foil to the substrate, curing the gel stage epoxy glass substrate and causing the substrate material to flow and fill the holes to provide a flexible surface;
   forming a layer of circuit lead material;
   applying a plating resist thereover;
   exposing the resist to circuit patterns;
   developing the resist;
   etching away unexposed lead material;
   stripping the plating resist;
   forming a coating of photosensitive mask material;
   exposing the mask to artwork;
   developing the exposed mask; and
   plating metallic layers.

2. The method of claim 1 wherein the forming step includes roll laminating a dry film photosensitive solder mask protective coat.

3. The method of claims 1 or 2 wherein the plating step includes forming a nickel layer in contact with the layer of circuit lead material through discontinuities in the mask; and forming a gold layer coextensive with the nickel.

4. An improved process for making contacts for flexible module carriers including the steps of providing a metal clad, cured B stage epoxy flexible section in a glass epoxy substrate;

generating circuitry in desired patterns on the substrate, said circuitry terminating on the flexible section of the substrate; and fabricating connector pads for the circuitry terminating on the flexible section of the substrate.

5. The method of claim 4 wherein the providing step comprises:

removing a portion of the glass epoxy substrate where contacts are to be formed;

cladding the substrate with copper foil; and applying heat and pressure to the copper cladded substrate, whereby the copper adheres to the substrate, and the substrate material flows, filling with cured epoxy the area from which a portion was removed.

* * * * *